United States Patent
Hasegawa et al.

(10) Patent No.: US 9,337,174 B2
(45) Date of Patent: May 10, 2016

(54) SEMICONDUCTOR DEVICE FOR SUPPRESSING INDUCTANCE

(71) Applicant: Kabushiki Kaisha Toshiba, Minato-ku (JP)

(72) Inventors: Kohei Hasegawa, Yokohama (JP); Takashi Yamamoto, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 113 days.

(21) Appl. No.: 14/478,264

(22) Filed: Sep. 5, 2014

(65) Prior Publication Data

US 2015/0262935 A1 Sep. 17, 2015

(30) Foreign Application Priority Data

Mar. 11, 2014 (JP) .................. 2014-047567

(51) Int. Cl.
*H01L 25/00* (2006.01)
*H01L 25/07* (2006.01)
*H01L 23/64* (2006.01)
*H01L 25/18* (2006.01)

(52) U.S. Cl.
CPC .............. *H01L 25/072* (2013.01); *H01L 23/64* (2013.01); *H01L 25/18* (2013.01); *H01L 2224/48091* (2013.01); *H01L 2224/48227* (2013.01); *H01L 2224/49113* (2013.01); *H01L 2924/1203* (2013.01); *H01L 2924/1306* (2013.01); *H01L 2924/30107* (2013.01)

(58) Field of Classification Search
CPC ....... H01L 25/072; H01L 23/64; H01L 25/18; H01L 2224/48091; H01L 2224/48227; H01L 2224/49113; H01L 2924/1203; H01L 2924/1306; H01L 2924/30107
See application file for complete search history.

(56) References Cited

U.S. PATENT DOCUMENTS

| | | | | |
|---|---|---|---|---|
| 9,142,551 | B2 * | 9/2015 | Shimizu | H01L 27/0635 |
| 9,214,459 | B2 * | 12/2015 | Takao | H01L 23/642 |
| 2014/0084993 | A1 * | 3/2014 | Takao | G05F 3/20 327/534 |
| 2015/0229206 | A1 * | 8/2015 | Kaji | H02M 7/003 307/43 |

FOREIGN PATENT DOCUMENTS

| | | |
|---|---|---|
| JP | 2007-6584 | 1/2007 |
| JP | 2011-23570 | 2/2011 |
| JP | 2012-118336 | 6/2012 |
| JP | 2013-118336 | 6/2013 |

* cited by examiner

*Primary Examiner* — Jung Kim (74) *Attorney, Agent, or Firm* — Oblon, McClelland, Maier & Neustadt, L.L.P.

(57) ABSTRACT

According to one embodiment, a semiconductor device includes first to fourth circuit substrates. Each of the first to fourth circuit substrates includes a switching device. The first circuit substrate includes a first terminal unit and a second terminal unit set to a potential lower than a potential of the first terminal unit. The third circuit substrate includes a fifth terminal unit and a sixth terminal unit set to a potential lower than a potential of the fifth terminal unit. The first circuit substrate overlaps the third circuit substrate. The second circuit substrate overlaps the fourth circuit substrate. A direction from the first terminal unit toward the second terminal unit is reversely oriented with respect to a direction from the fifth terminal unit toward the sixth terminal unit.

20 Claims, 7 Drawing Sheets

SEMICONDUCTOR DEVICE FOR SUPPRESSING INDUCTANCE

CROSS-REFERENCE TO RELATED APPLICATIONS

This application is based upon and claims the benefit of priority from Japanese Patent Application No. 2014-047567, filed on Mar. 11, 2014; the entire contents of which are incorporated herein by reference.

FIELD

Embodiments described herein relate generally to a semiconductor device.

BACKGROUND

For example, there is a semiconductor device such as an inverter that uses a semiconductor element, etc. For example, the semiconductor element is mounted to a substrate using an interconnect. In such a semiconductor device, it is desirable to obtain high reliability by suppressing the inductance due to the interconnect.

DETAILED DESCRIPTION

According to one embodiment, a semiconductor device includes a first circuit substrate, a second circuit substrate, a third circuit substrate, and a fourth circuit substrate. The first circuit substrate includes a first substrate having a first surface, a first switching element provided at the first surface, a first terminal unit provided in the first substrate, and a second terminal unit provided in the first substrate. The first terminal unit is electrically connected to the first switching element. The second terminal unit is electrically connected to the first switching element. The second terminal unit is set to a potential lower than a potential of the first terminal unit. The second circuit substrate includes a second substrate having a second surface, a second switching element provided at the second surface, a third terminal unit provided in the second substrate and a fourth terminal unit provided in the second substrate. The third terminal unit is electrically connected to the second switching element, and the fourth terminal unit is electrically connected to the second switching element. The fourth terminal unit is set to a potential lower than a potential of the third terminal unit. The third circuit substrate includes a third substrate having a third surface, a third switching element provided at the third surface, a fifth terminal unit provided in the third substrate, and a sixth terminal unit provided in the third substrate. The fifth terminal unit is electrically connected to the third switching element. The sixth terminal unit is electrically connected to the third switching element. The sixth terminal unit is set to a potential lower than a potential of the fifth terminal unit. The fourth circuit substrate includes a fourth substrate having a fourth surface, a fourth switching element provided at the fourth surface, a seventh terminal unit provided in the fourth substrate, and an eighth terminal unit provided in the fourth substrate. The seventh terminal unit is electrically connected to the fourth switching element. The eighth terminal unit is electrically connected to the fourth switching element. The eighth terminal unit is set to a potential lower than a potential of the seventh terminal unit. The second terminal unit and the third terminal unit are electrically connected. The sixth terminal unit and the seventh terminal unit are electrically connected. The third surface overlaps at least a portion of the first surface when projected onto the first surface. The fourth surface overlaps at least a portion of the second surface when projected onto the second surface. A component of a direction from the first terminal unit toward the second terminal unit is reversely oriented with respect to a component of a direction from the fifth terminal unit toward the sixth terminal unit when projected onto a plane including a first direction from the first circuit substrate toward the second circuit substrate and a second direction from the first circuit substrate toward the third circuit substrate. A component of a direction from the third terminal unit toward the fourth terminal unit is reversely oriented with respect to a component of a direction from the seventh terminal unit toward the eighth terminal unit when projected onto the plane.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1:
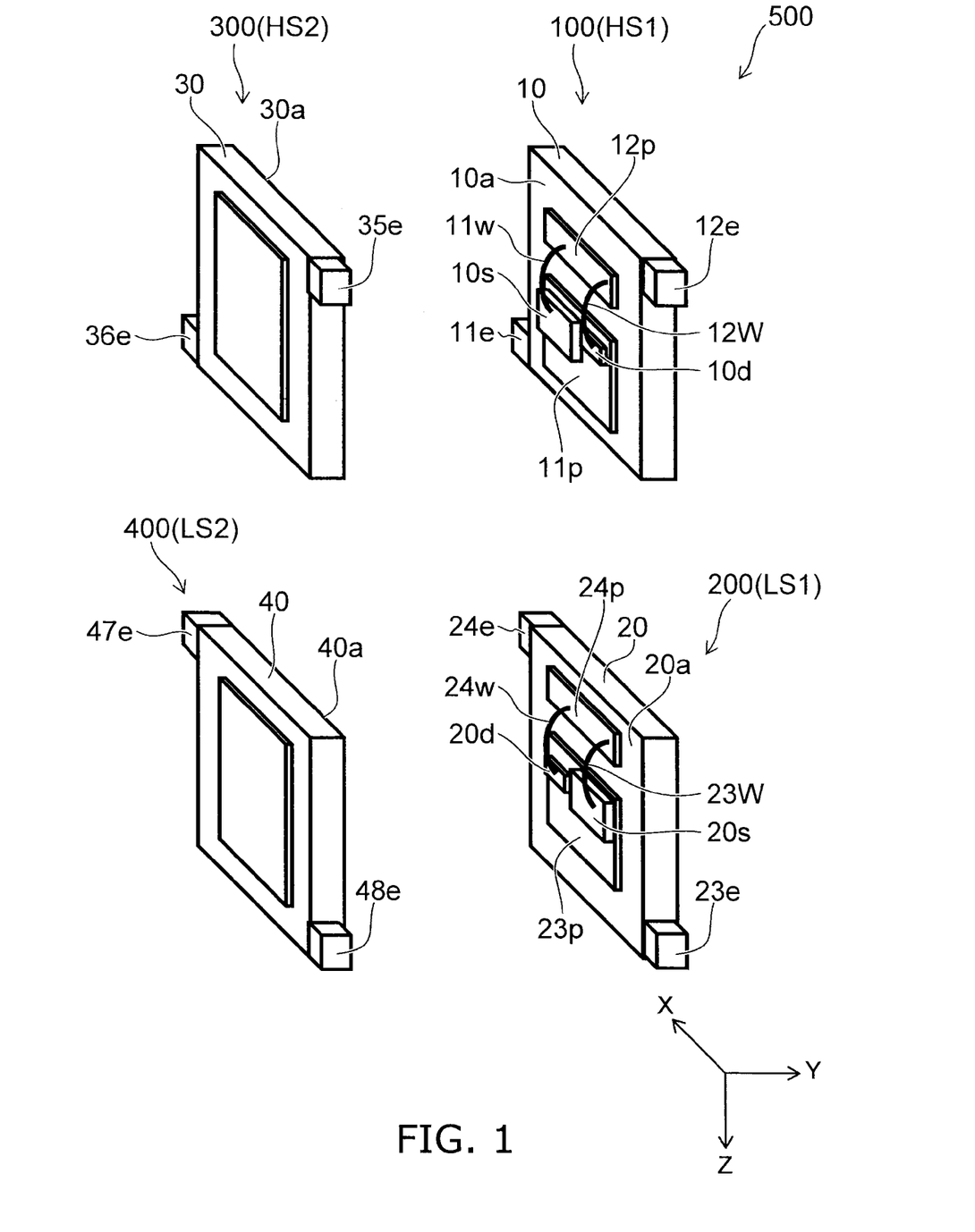
FIG. 1 is a schematic perspective view illustrating a semiconductor device according to a first embodiment.

FIG. 1 is a schematic perspective view illustrating a semiconductor device according to a first embodiment.

FIG. 1 shows the semiconductor device 500 according to the embodiment.

As shown in FIG. 1, the semiconductor device 500 includes a first circuit substrate 100, a second circuit substrate 200, a third circuit substrate 300, and a fourth circuit substrate 400.

Figure 2A:
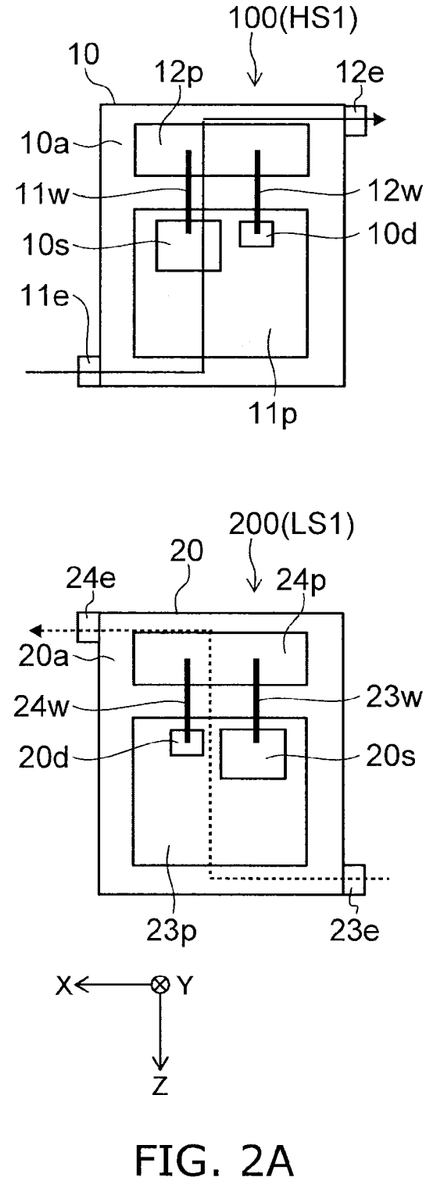
FIG. 2A and FIG. 2B are schematic plan views illustrating the semiconductor device according to the first embodiment.
Figure 2B:
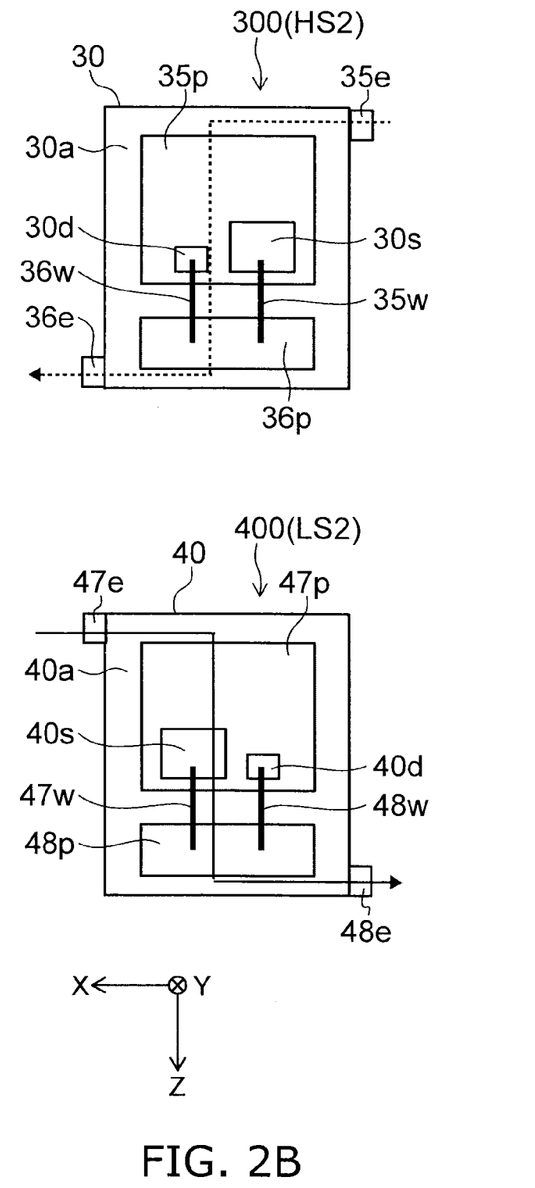

FIG. 2A and FIG. 2B are schematic plan views illustrating the semiconductor device according to the first embodiment.

FIG. 2A is a schematic plan view illustrating the first circuit substrate 100 and the second circuit substrate 200 of the semiconductor device 500.

FIG. 2B is a perspective plan view illustrating the third circuit substrate 300 and the fourth circuit substrate 400 of the semiconductor device 500.

Figure 3:
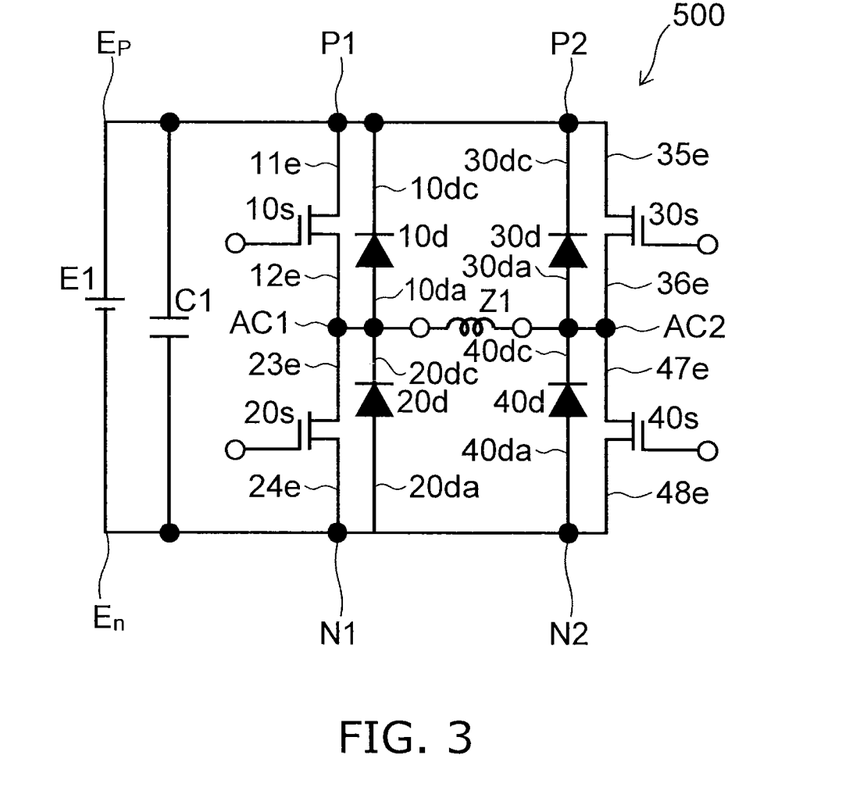
FIG. 3 is a circuit diagram illustrating the semiconductor device according to the first embodiment.

FIG. 3 is a circuit diagram illustrating the semiconductor device according to the first embodiment.

FIG. 3 shows the circuit diagram of the semiconductor device 500.

As shown in FIG. 3, the semiconductor device 500 is, for example, an inverter circuit.

Some of the components included in the semiconductor device 500 are not shown for easier viewing in FIG. 1, FIG. 2A, and FIG. 2B. For example, the interconnects that connect the first circuit substrate 100 and the second circuit substrate 200, etc., are not shown.

As shown in FIG. 1 and FIG. 2A, the first circuit substrate 100 includes a first substrate 10, a first switching element 10s, a first terminal unit 11e, and a second terminal unit 12e.

The first substrate 10 has a first surface 10a. The first switching element 10s is provided at the first surface 10a.

In the example, the first circuit substrate 100 further includes a first interconnect unit 11p, a second interconnect unit 12p, and a first connection member 11w. The first interconnect unit 11p, the second interconnect unit 12p, and the first connection member 11w are provided at the first surface 10a.

The first connection member 11w electrically connects the first switching element 10s and the second interconnect unit 12p.

The first interconnect unit 11p electrically connects the first switching element 10s and the first terminal unit 11e. The second interconnect unit 12p electrically connects the first switching element 10s and the second terminal unit 12e via the first connection member 11w.

In other words, the first terminal unit 11e is electrically connected to the first switching element 10s via the first interconnect unit 11p. The second terminal unit 12e is electrically connected to the first switching element 10s via the second interconnect unit 12p.

In the embodiment, the state of being electrically connected includes the state in which two conductors are in direct contact and the state in which a current flows between two conductors that have another conductor inserted therebetween.

For example, the first switching element 10s and the switching elements included in the semiconductor device 500 include semiconductor elements such as bipolar transistors, field effect transistors (FETs), etc. In the example, the first switching element 10s is a FET. The FET includes a source terminal, a drain terminal, and a gate terminal. For example, the drain terminal of the first switching element 10s is electrically connected to the first interconnect unit 11p. For example, the source terminal of the first switching element 10s is electrically connected to the second interconnect unit 12p.

In the operation of the semiconductor device 500, the second terminal unit 12e is set to a potential that is lower than that of the first terminal unit 11e.

In the example, the first circuit substrate 100 further includes a first diode 10d and a second connection member 12w. The first diode 10d includes, for example, a first anode 10da and a first cathode 10dc.

The second connection member 12w electrically connects the first diode 10d and the second interconnect unit 12p. The first cathode 10dc is electrically connected to the first terminal unit 11e. The first anode 10da is electrically connected to the second terminal unit 12e (referring to FIG. 3).

The second circuit substrate 200 includes a second substrate 20, a second switching element 20s, a third terminal unit 23e, and a fourth terminal unit 24e.

The second substrate 20 has a second surface 20a. The second switching element 20s is provided at the second surface 20a.

In the example, the second circuit substrate 200 further includes a third interconnect unit 23p, a fourth interconnect unit 24p, and a third connection member 23w. The third interconnect unit 23p, the fourth interconnect unit 24p, and the third connection member 23w are provided at the second surface 20a.

The third connection member 23w electrically connects the second switching element 20s and the fourth interconnect unit 24p.

The third interconnect unit 23p electrically connects the second switching element 20s and the third terminal unit 23e. The fourth interconnect unit 24p electrically connects the second switching element 20s and the fourth terminal unit 24e via the third connection member 23w.

In other words, the third terminal unit 23e is electrically connected to the second switching element 20s via the third interconnect unit 23p. The fourth terminal unit 24e is electrically connected to the second switching element 20s via the fourth interconnect unit 24p.

In the example, the second switching element 20s is a FET. For example, the drain terminal of the second switching element 20s is electrically connected to the third interconnect unit 23p. For example, the source terminal of the second switching element 20s is electrically connected to the fourth interconnect unit 24p.

In the operation of the semiconductor device 500, the fourth terminal unit 24e is set to a potential that is lower than that of the third terminal unit 23e.

In the example, the second circuit substrate 200 further includes a second diode 20d and a fourth connection member 24w. The second diode 20d includes, for example, a second anode 20da and a second cathode 20dc.

The fourth connection member 24w electrically connects the second diode 20d and the fourth interconnect unit 24p. The second cathode 20dc is electrically connected to the third terminal unit 23e. The second anode 20da is electrically connected to the fourth terminal unit 24e.

A direction (a first direction) from the first circuit substrate 100 toward the second circuit substrate 200 is taken as a Z-axis direction. One direction perpendicular to the Z-axis direction is taken as an X-axis direction. A direction perpendicular to the Z-axis direction and perpendicular to the X-axis direction is taken as a Y-axis direction.

The second circuit substrate 200 is arranged with the first circuit substrate 100 in the Z-axis direction. For example, the first surface 10a of the first substrate 10 and the second surface 20a of the second substrate 20 are substantially parallel to the Z-axis direction. For example, the first surface 10a and the second surface 20a are substantially parallel. For example, the second substrate 20 is disposed in a plane including the first surface 10a.

As shown in FIG. 2B, the third circuit substrate 300 includes a third substrate 30, a third switching element 30s, a fifth terminal unit 35e, and a sixth terminal unit 36e.

The third substrate 30 has a third surface 30a. The third switching element 30s is provided at the third surface 30a.

In the example, the third circuit substrate 300 further includes a fifth interconnect unit 35p, a sixth interconnect unit 36p, and a fifth connection member 35w. The fifth interconnect unit 35p, the sixth interconnect unit 36p, and the fifth connection member 35w are provided at the third surface 30a.

The fifth connection member 35w electrically connects the third switching element 30s and the sixth interconnect unit 36p.

The fifth interconnect unit 35p electrically connects the third switching element 30s and the fifth terminal unit 35e. The sixth interconnect unit 36p electrically connects the third switching element 30s and the sixth terminal unit 36e via the fifth connection member 35w.

In other words, the fifth terminal unit 35e is electrically connected to the third switching element 30s via the fifth interconnect unit 35p. The sixth terminal unit 36e is electrically connected to the third switching element 30s via the sixth interconnect unit 36p.

In the example, the third switching element 30s is a FET. For example, the drain terminal of the third switching element 30s is electrically connected to the fifth interconnect unit 35p. For example, the source terminal of the third switching element 30s is electrically connected to the sixth interconnect unit 36p.

In the operation of the semiconductor device 500, the sixth terminal unit 36e is set to a potential that is lower than that of the fifth terminal unit 35e.

In the example, the third circuit substrate 300 further includes a third diode 30d and a sixth connection member 36w. The third diode 30d includes, for example, a third anode 30da and a third cathode 30dc.

The sixth connection member 36w electrically connects the third diode 30d and the sixth interconnect unit 36p. The third cathode 30dc is electrically connected to the fifth terminal unit 35e. The third anode 30da is electrically connected to the sixth terminal unit 36e.

For example, the third circuit substrate 300 is arranged with the first circuit substrate 100 in a direction (a second direction, e.g., the Y-axis direction) intersecting the Z-axis direction. For example, the third surface 30a is substantially parallel to the Z-axis direction. For example, the third surface 30a is substantially parallel to the first surface 10a.

As shown in FIG. 2B, the fourth circuit substrate 400 includes a fourth substrate 40, a fourth switching element 40s, a seventh terminal unit 47e, and an eighth terminal unit 48e.

The fourth substrate 40 has a fourth surface 40a. The fourth switching element 40s is provided at the fourth surface 40a.

In the example, the fourth circuit substrate 400 further includes a seventh interconnect unit 47p, an eighth interconnect unit 48p, and a seventh connection member 47w. The seventh interconnect unit 47p, the eighth interconnect unit 48p, and the seventh connection member 47w are provided at the fourth surface 40a.

The seventh connection member 47w electrically connects the fourth switching element 40s and the eighth interconnect unit 48p.

The seventh interconnect unit 47p electrically connects the fourth switching element 40s and the seventh terminal unit 47e. The eighth interconnect unit 48p electrically connects the fourth switching element 40s and the eighth terminal unit 48e via the seventh connection member 47w.

In other words, the seventh terminal unit 47e is electrically connected to the fourth switching element 40s via the seventh interconnect unit 47p. The eighth terminal unit 48e is electrically connected to the fourth switching element 40s via the eighth interconnect unit 48p.

In the example, the fourth switching element 40s is a FET. For example, the drain terminal of the fourth switching element 40s is electrically connected to the seventh interconnect unit 47p. For example, the source terminal of the fourth switching element 40s is electrically connected to the eighth interconnect unit 48p.

In the operation of the semiconductor device 500, the eighth terminal unit 48e is set to a potential that is lower than that of the seventh terminal unit 47e.

In the example, the fourth circuit substrate 400 further includes a fourth diode 40d and an eighth connection member 48w. The fourth diode 40d includes, for example, a fourth anode 40da and a fourth cathode 40dc.

The eighth connection member 48w electrically connects the fourth diode 40d and the eighth interconnect unit 48p. The fourth cathode 40dc is electrically connected to the seventh terminal unit 47e. The fourth anode 40da is electrically connected to the eighth terminal unit 48e.

As shown in FIG. 3, the second terminal unit 12e and the third terminal unit 23e are electrically connected. The sixth terminal unit 36e and the seventh terminal unit 47e are electrically connected.

The fourth circuit substrate 400 is arranged with the second circuit substrate in the second direction (e.g., the Y-axis direction) from the first circuit substrate 100 toward the third circuit substrate 300. The fourth circuit substrate 400 is arranged with the third circuit substrate in the first direction (the Z-axis direction) from the first circuit substrate 100 toward the second circuit substrate 200. For example, the fourth surface 40a is substantially parallel to the second surface 20a. For example, the fourth surface 40a is substantially parallel to the third surface. For example, the fourth substrate 40 is disposed in a plane including the third surface 30a.

As shown in FIG. 1, the third surface 30a overlaps at least a portion of the first surface 10a when projected onto the first surface 10a. For example, the first surface 10a opposes the third surface 30a. In other words, the first switching element 10s is provided between the first surface 10a and the third surface 30a. The third switching element 30s is provided between the first surface 10a and the third surface 30a.

For example, the sixth interconnect unit 36p overlaps at least a portion of the first interconnect unit 11p when projected onto the first surface 10a. For example, the fifth interconnect unit 35p overlaps at least a portion of the second interconnect unit 12p when projected onto the first surface 10a.

In the semiconductor device 500, a component of the direction from the first interconnect unit 11p toward the second interconnect unit 12p is reversely oriented with respect to a component of the direction from the fifth interconnect unit 35p toward the sixth interconnect unit 36p.

For example, a component of the direction from the first terminal unit 11e toward the second terminal unit 12e is reversely oriented with respect to a component of the direction from the fifth terminal unit 35e toward the sixth terminal unit 36e when projected onto the Y-Z plane (the plane including the first direction and the second direction).

For example, in the operation of the semiconductor device 500 as described below, the current flows from the first terminal unit 11e through the first switching element 10s toward the second terminal unit 12e. For example, the current flows from the fifth terminal unit 35e through the third switching element 30s toward the sixth terminal unit 36e. The broken-line arrows of FIG. 2 schematically illustrate the orientation of the current flowing in each of the circuit substrates.

Thus, a component of the orientation of the current flowing from the first terminal unit 11e toward the second terminal unit 12e of the first circuit substrate 100 is reversely oriented with respect to a component of the orientation of the current flowing from the fifth terminal unit 35e toward the sixth terminal unit 36e of the third circuit substrate 300. Thereby, the mutual inductance between the first circuit substrate 100 and the third circuit substrate 300 can be reduced.

The fourth surface 40a overlaps at least a portion of the second surface 20a when projected onto the second surface 20a. For example, the second surface 20a opposes the fourth surface 40a. In other words, the second switching element 20s is provided between the second surface 20a and the fourth surface 40a. The fourth switching element 40s is provided between the second surface 20a and the fourth surface 40a.

For example, the eighth interconnect unit 48p overlaps at least a portion of the third interconnect unit 23p when projected onto the second surface 20a. For example, the seventh interconnect unit 47p overlaps at least a portion of the fourth interconnect unit 24p when projected onto the second surface 20a.

In the semiconductor device 500, a component of the direction from the third interconnect unit 23p toward the fourth interconnect unit 24p is reversely oriented with respect to a component of the direction from the seventh interconnect unit 47p toward the eighth interconnect unit 48p.

For example, a component of the direction from the third terminal unit 23e toward the fourth terminal unit 24e is reversely oriented with respect to a component of the direction from the seventh terminal unit 47e toward the eighth terminal unit 48e when projected onto the Y-Z plane.

For example, in the operation of the semiconductor device 500 as described below, the current flows from the third terminal unit 23e through the second switching element 20s toward the fourth terminal unit 24e. For example, the current flows from the seventh terminal unit 47e through the fourth switching element 40s toward the eighth terminal unit 48e.

Thus, a component of the orientation of the current flowing from the third terminal unit 23e toward the fourth terminal unit 24e of the second circuit substrate 200 is reversely oriented with respect to a component of the orientation of the current flowing from the seventh terminal unit 47e toward the eighth terminal unit 48e of the fourth circuit substrate 400. Thereby, the mutual inductance between the second circuit substrate 200 and the fourth circuit substrate 400 can be reduced.

The operation of the semiconductor device 500 will now be described.

Figure 4A:
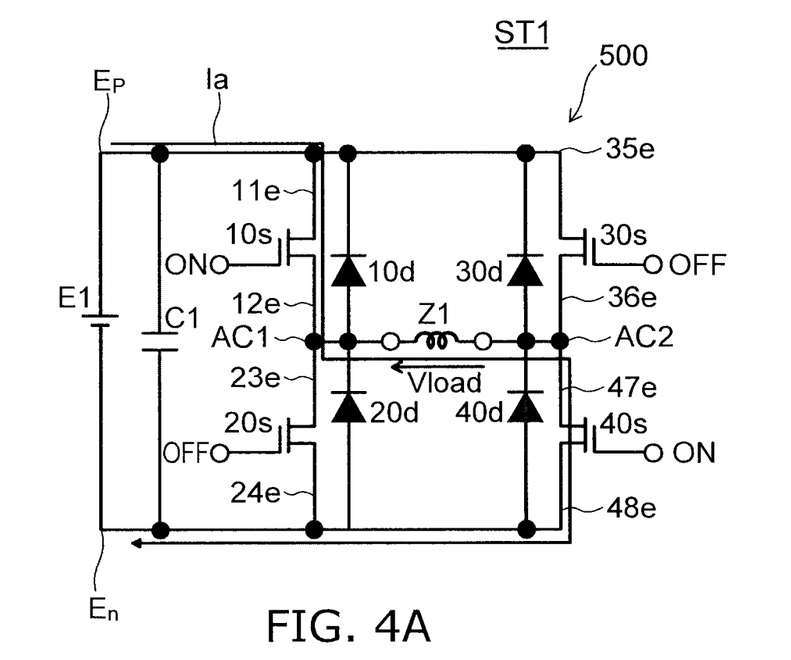
FIG. 4A and FIG. 4B are circuit diagrams illustrating the operation of the semiconductor device according to the first embodiment.
Figure 4B:
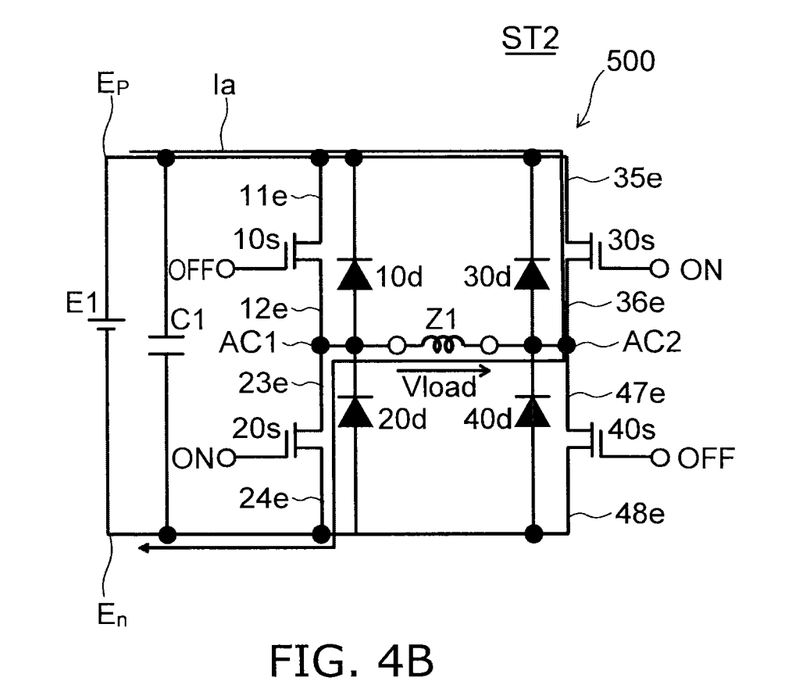

FIG. 4A and FIG. 4B are circuit diagrams illustrating the operation of the semiconductor device according to the first embodiment.

As shown in FIG. 4A and FIG. 4B, the semiconductor device 500 is electrically connected to a voltage source E1. The first terminal unit 11e and the fifth terminal unit 35e are electrically connected to a positive side Ep of the voltage source E1. The fourth terminal unit 24e and the eighth terminal unit 48e are electrically connected to a negative side En of the voltage source E1.

The semiconductor device 500 is, for example, a full bridge circuit. The circuit of the first circuit substrate 100 is, for example, a high-side circuit (a first high-side circuit HS1). The circuit of the second circuit substrate 200 is, for example, a low-side circuit (a first low-side circuit LS1). The circuit of the third circuit substrate 300 is, for example, a high-side circuit (a second high-side circuit HS2). The circuit of the fourth circuit substrate 400 is, for example, a low-side circuit (a second low-side circuit LS2).

The semiconductor device 500 is electrically connected to a condenser C1. The first terminal unit 11e and the fifth terminal unit 35e are connected to one end of the condenser C1. The fourth terminal unit 24e and the eighth terminal unit 48e are connected to the other end of the condenser C1.

The second terminal unit 12e and the third terminal unit 23e are electrically connected and are connected to one end of a load Z1 as an output terminal AC1. The sixth terminal unit 36e and the seventh terminal unit 47e are electrically connected and are connected to the other end of the load Z1 as an output terminal AC2. The load Z1 is, for example, an inductance.

In the operation of the semiconductor device 500, the first to fourth switching elements 10s to 40s are caused to perform switching. Thereby, the semiconductor device 500 converts a direct current voltage into an alternating current voltage. The capacitance of the condenser C1 is set to be large. Thereby, for example, a substantially constant voltage can be considered to be applied to the drain terminals of each of the switching elements even when performing the switching operation.

For example, the semiconductor device 500 alternately repeats a first state ST1 and a second state ST2.

In the first state ST1 as shown in FIG. 4A, the first switching element 10s and the fourth switching element 40s are switched to the on-state; and the second switching element 20s and the third switching element 30s are switched to the off-state.

In the second state ST2 as shown in FIG. 4B, the second switching element 20s and the third switching element 30s are switched to the on-state; and the first switching element 10s and the fourth switching element 40s are switched to the off-state.

In the on-state, a current flows between two ends (e.g., between the source terminal and the drain terminal) of the switching element.

In the first state ST1, a current Ia flows from the voltage source E1 through the first switching element 10s, the load Z1, and the fourth switching element 40s toward the voltage source E1. At this time, a voltage Vload is applied to the load Z1. In the first state ST1, the potential of the output terminal AC1 is higher than the potential of the output terminal AC2.

In the second state ST2, the current Ia flows from the voltage source E1 through the third switching element 30s, the load Z1, and the second switching element 20s toward the voltage source E1. At this time, the polarity of the voltage Vload that is applied to the load Z1 is the reverse of the polarity of the voltage Vload in the first state ST1. In the second state ST2, the potential of the output terminal AC1 is lower than the potential of the output terminal AC2.

Figure 5:
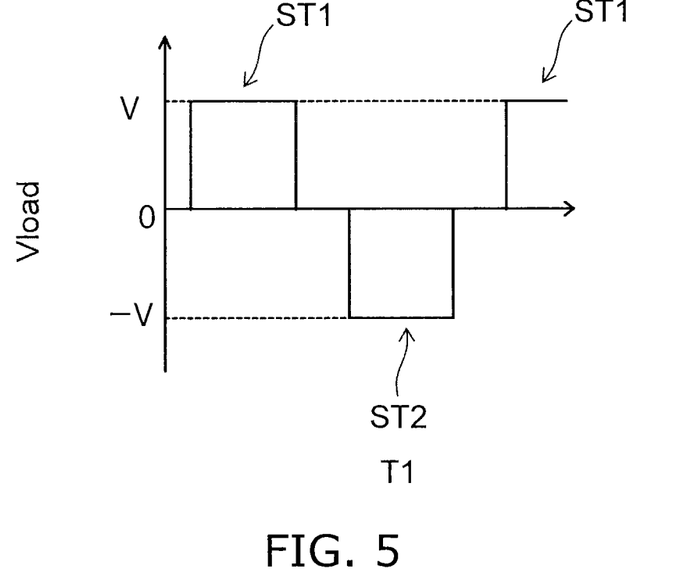
FIG. 5 is a graph of the operation of the semiconductor device according to the first embodiment.

FIG. 5 is a graph of the operation of the semiconductor device according to the first embodiment.

FIG. 5 shows the output of the semiconductor device 500. Namely, the voltage Vload that is applied to the load Z1 in the operation of the semiconductor device 500 described above is shown. The horizontal axis of FIG. 5 is a time T1; and the vertical axis of FIG. 5 is the voltage Vload.

In the first state ST1 as shown in FIG. 5, for example, the voltage Vload is positive. In the second state ST2, the voltage Vload is negative. The semiconductor device 500 alternately repeats the first state ST1 and the second state ST2. Thereby, an alternating current voltage can be obtained from the direct current voltage supplied from the voltage source E1.

For example, there are cases where the current Ia through the load Z1 cannot follow the abrupt direction change when switching from the first state ST1 to the second state ST2. Therefore, for example, a current that is reversely oriented with respect to the second switching element 20s and the third switching element 30s may flow. Thereby, the switching elements may be undesirably damaged. Therefore, in the semiconductor device 500, for example, the second diode 20d that is reversely oriented is connected between the drain and source of the second switching element 20s. A recovery current flows through the second diode 20d toward the voltage source E1. Thereby, the damage of the second switching element 20s can be prevented. Similarly, the first diode 10d, the third diode 30d, and the fourth diode 40d are provided. Thereby, for example, the damage of each of the switching elements can be prevented.

In the example, external diodes are provided. The recovery current may be caused to flow in body diodes provided in each of the switching elements; and the external diodes may be omitted.

Thus, the semiconductor device 500 operates as an inverter by causing the switching elements to perform switching operations.

Figure 6:
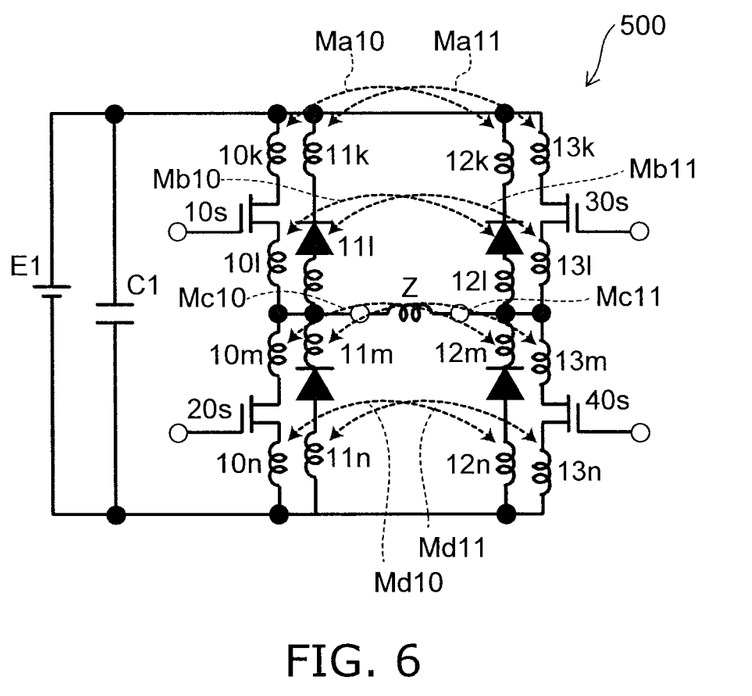
FIG. 6 is a circuit diagram illustrating the semiconductor device according to the first embodiment.

FIG. 6 is a circuit diagram illustrating the semiconductor device according to the first embodiment.

FIG. 6 is a circuit diagram illustrating the semiconductor device 500.

For example, the circuit diagrams of the semiconductor device 500 shown in FIG. 3 and FIG. 4 are ideal circuits. Conversely, in the case where an inverter circuit is configured, parasitic inductance occurs as shown in FIG. 6 due to the interconnect pattern, etc.

Figure 7A:
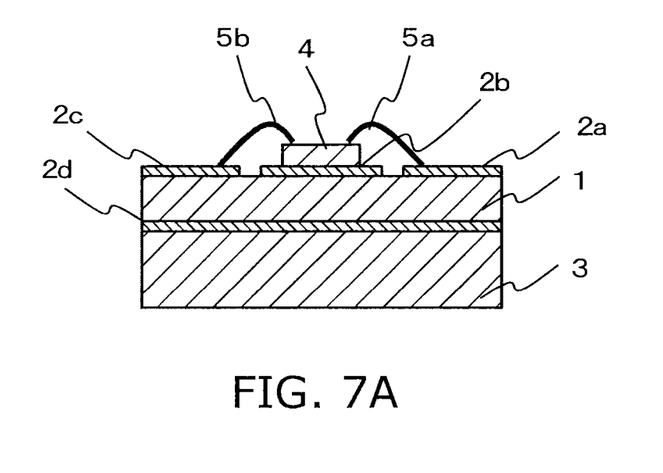
FIG. 7A to FIG. 7C are schematic views illustrating the semiconductor device.
Figure 7B:
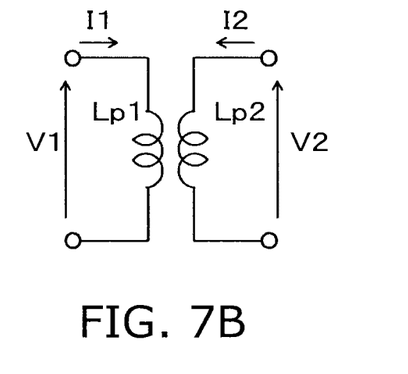
Figure 7C:
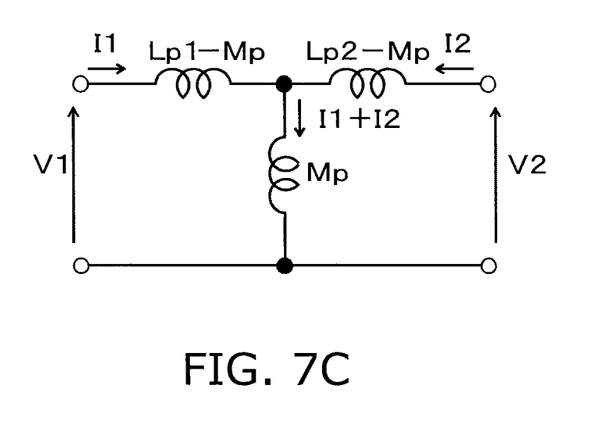

FIG. 7A to FIG. 7C are schematic views illustrating the semiconductor device.

In the case where a semiconductor chip 4 such as a FET, etc., is mounted to a substrate 1 as shown in FIG. 7A, for example, interconnect patterns 2a to 2d (interconnect units) are provided on the upper surface and the lower surface of the substrate 1. A base plate 3 and bonding wires 5a and 5b (connection members) are further provided. The base plate 3 dissipates the heat generated by the semiconductor chip 4. The base plate may be provided in the first to fourth circuit substrates 100 to 400 of the semiconductor device 500 as well.

The bonding wires 5a and 5b connect the semiconductor chip 4 and the interconnect patterns 2a and 2c. The substrate 1 may include, for example, a ceramic substrate of aluminum nitride, silicon nitride, etc. Such a ceramic substrate has, for example, a high thermal conductivity and/or a high breakdown voltage. Such a substrate may be included in the first to fourth substrates 10 to 40 used in the semiconductor device 500 as well.

Die bonding of the semiconductor chip 4 to the interconnect pattern 2b of the substrate 1 is performed. The terminals of the semiconductor chip are connected to the interconnect patterns 2a and 2c of the substrate 1 by wire bonding. In such a case, the interconnect patterns and the bonding wires have inductance components which are parasitic inductance. For example, the parasitic inductance can be extracted by utilizing quasi-static electromagnetic field analysis tools.

FIG. 6 is a circuit diagram of the semiconductor device 500 considering such parasitic inductance. Considering the parasitic inductance, for example, inductances $10k$ to $10n$, $11k$ to $11n$, $12k$ to $12n$, and $13k$ to $13n$ are added.

For example, in the switching operation, a spike voltage V1 expressed by V1=Lp×di/dt occurs due to the temporal change of a current i and all of parasitic inductances Lp occurring in the path of the current. As in the formula recited above, the spike voltage V1 increases as the parasitic inductance Lp increases. The FET may be damaged when the spike voltage V1 exceeds the rated voltage of the FET. In a power module, the parasitic inductance has a small value. Thereby, for example, the damage of the FET can be prevented.

In the semiconductor device, mutual inductance is large in the case where coupling of adjacent parasitic inductances is strong. For example, mutual inductances Ma10 to Md10 and Ma11 to Md11 are added as shown in FIG. 6. For example, the damage of the FET can be prevented by setting the mutual inductances to have small values.

FIG. 7B is a circuit diagram showing the inductances Lp (an inductance Lp1 and an inductance Lp2) that are adjacent to each other. FIG. 7C is an equivalent circuit diagram of FIG. 7B when a mutual inductance Mp of the adjacent inductances Lp is considered.

For example, the mutual inductance Mp is expressed by $Mp=k\times(Lp1\times Lp2)^{1/2}$ using the coupling coefficient k. For example, the current flowing toward the inductance Lp1 is I1; and the current flowing toward the inductance Lp2 is I2. As shown in FIG. 7C, in the case where the orientation of the current I1 flowing in the inductance Lp1 and the orientation of the current I2 flowing in the inductance Lp2 are the same, the voltage applied to the two ends of the mutual inductance Mp is Mp×(I1+I2). Thus, in the case where the orientations of the current flowing in each of the adjacent inductances are the same, the effect of the mutual inductance Mp is large.

For example, the orientations of the current flowing in each of the adjacent inductances may be reversely oriented with respect to each other. Thereby, the effect of the parasitic inductances can be reduced.

In the semiconductor device 500 according to the embodiment as described above, the first circuit substrate 100 (the first high-side circuit HS1) and the third circuit substrate 300 (the second high-side circuit HS2) oppose each other. The second circuit substrate 200 (the first low-side circuit LS1) and the fourth circuit substrate 400 (the second low-side circuit LS2) oppose each other. Thus, for example, the opposing circuit substrates are not simultaneously switched to the on-state in the operation of the semiconductor device 500.

In the first state ST1, the current flows from the first terminal unit lie via the first switching element 10s toward the second terminal unit 12e. The current flows from the seventh terminal unit 47e toward the eighth terminal unit 48e via the load Z1 between the second terminal unit 12e and the seventh terminal unit 47e. For example, the path and direction of the current are as illustrated by the solid line arrows of FIG. 2A and FIG. 2B.

On the other hand, in the second state ST2, the current flows from the fifth terminal unit 35e via the third switching element 30s toward the sixth terminal unit 36e. The current flows from the third terminal unit 23e toward the fourth terminal unit 24e via the load Z1 between the sixth terminal unit 36e and the third terminal unit 23e. For example, the path and direction of the current are as illustrated by the broken line arrows of FIG. 2A and FIG. 2B.

In the embodiment, the first circuit substrate 100 and the third circuit substrate 300 oppose each other. Thus, the switching elements provided in the opposing substrates are not simultaneously switched to the on-state. In other words, the first switching element 10s and the third switching element 30s are not simultaneously switched to the on-state. Further, components of the direction of the current flowing in the first switching element 10s and the direction of the current flowing in the third switching element 30s are reversely oriented with respect to each other. Thus, the orientations of the current flowing in each of the adjacent inductances are set to be reversely oriented with respect to each other. Thereby, the effect of the parasitic inductances can be reduced; and the application of an excessive voltage to the switching elements can be suppressed. A highly reliable semiconductor device can be obtained.

Similarly, in the embodiment, the second circuit substrate 200 and the fourth circuit substrate 400 oppose each other. Thus, the switching elements that are provided in the opposing substrates are not simultaneously switched to the on-state. In other words, the second switching element 20s and the fourth switching element 40s are not simultaneously switched to the on-state. Further, components of the direction of the current flowing in the second switching element 20s and the direction of the current flowing in the fourth switching element 40s are reversely oriented with respect to each other. Thus, the orientations of the current flowing in each of the adjacent inductances are reversely oriented with respect to each other. Thereby, the effect of the parasitic inductances can be reduced; and the application of an excessive voltage to the switching elements can be suppressed. A highly reliable semiconductor device can be obtained.

Thus, in the embodiment, the first to fourth circuit substrates 100 to 400 are disposed three-dimensionally. Thereby, the mounting surface area can be reduced.

Figure 8:
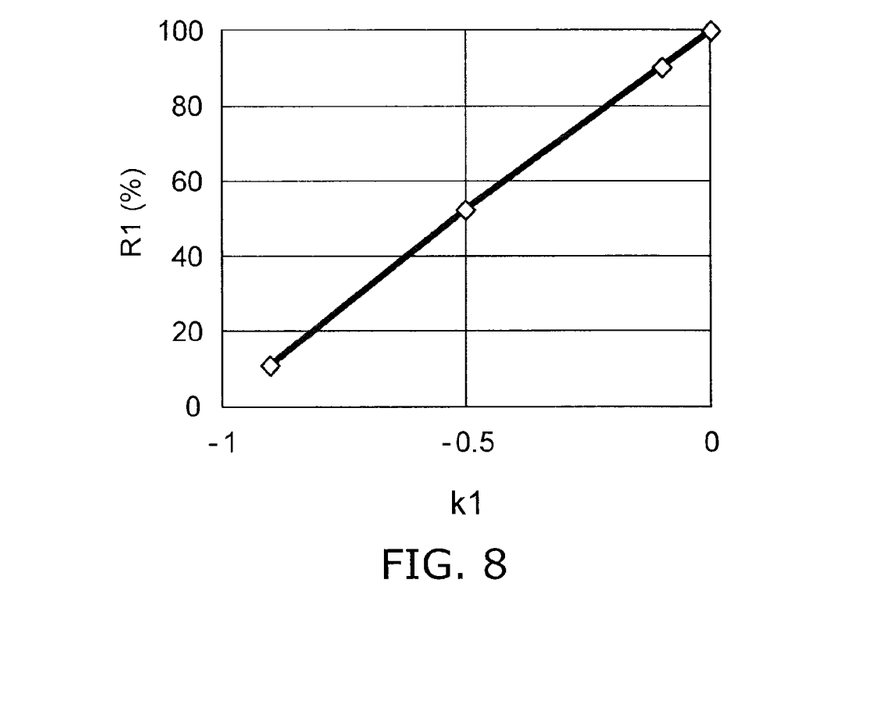
FIG. 8 is a graph of a characteristic of the semiconductor device according to the first embodiment.

FIG. 8 is a graph of a characteristic of the semiconductor device according to the first embodiment.

FIG. 8 shows the results of calculations of the parasitic inductance of the semiconductor device 500. The parasitic inductance can be calculated using circuit analysis tools. The parasitic inductance shown in FIG. 8 is calculated using the circuit model shown in FIG. 6.

In the circuit analysis, the parameters of the circuit model of the FETs and the diodes were adjusted to reproduce the electrical characteristics of a commercial device. For easier calculation of the total parasitic inductance of the full bridge circuit, the parasitic inductance at each location was set to 10 nH which is larger than that assumed. Then, the voltage waveform applied to the two ends of the load Z1 when switching between the first state ST1 and the second state ST2 was analyzed. From the analysis results, the total parasitic inductance was calculated based on the resonant frequency of the ringing at turn-off.

FIG. 8 shows a reduction rate R1 (%) of the total parasitic inductance as a coupling coefficient k1 of the inductance of a first circuit (the first circuit substrate 100 and the second circuit substrate 200) and the inductance of a second circuit (the third circuit substrate 300 and the fourth circuit substrate 400) is changed. As shown in FIG. 8, it was found that the total parasitic inductance for the full bridge circuit was reduced drastically by causing reversely-oriented currents to flow in the first circuit and the second circuit.

Second Embodiment

Figure 9A:
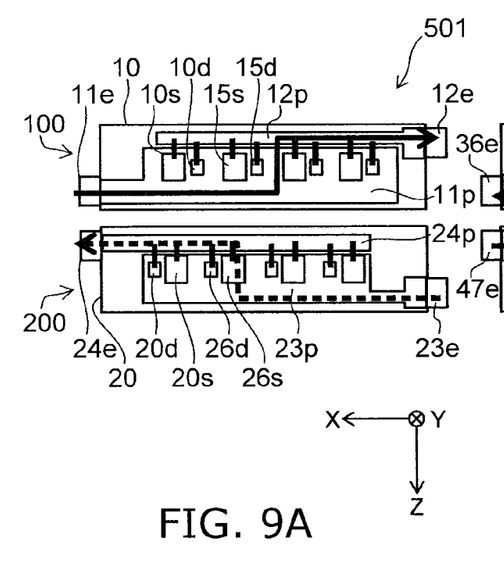
FIG. 9A and FIG. 9B are schematic plan views illustrating a semiconductor device according to a second embodiment.
Figure 9B:
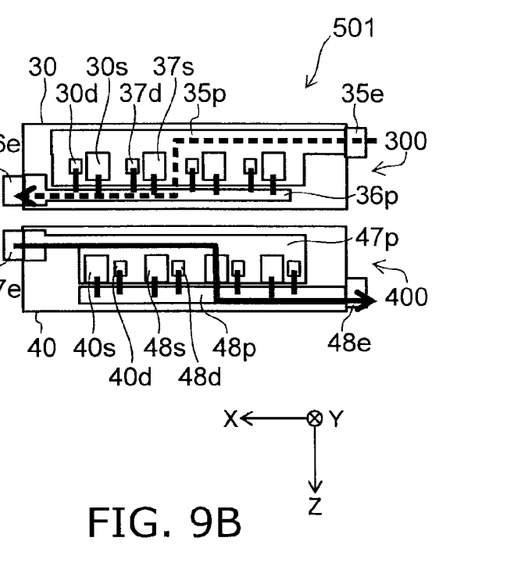

FIG. 9A and FIG. 9B are schematic plan views illustrating a semiconductor device according to a second embodiment.

FIG. 9A is a schematic plan view showing the first circuit substrate 100 and the second circuit substrate 200 of the semiconductor device 501.

FIG. 9B is a perspective plan view showing the third circuit substrate 300 and the fourth circuit substrate 400 of the semiconductor device 501.

Each of the first to fourth circuit substrates 100 to 400 of the semiconductor device 501 includes multiple switching elements and multiple diodes. Otherwise, a configuration similar to the configuration described in regard to the semiconductor device 500 is applicable to the semiconductor device 501.

For example, the first circuit substrate 100 further includes a fifth switching element 15s and a fifth diode 15d. Each of the fifth switching element 15s and the fifth diode 15d is provided at the first surface 10a. Each of the fifth switching element 15s and the fifth diode 15d is electrically connected to the first terminal unit 11e and the second terminal unit 12e.

The second circuit substrate 200 further includes a sixth switching element 26s and a sixth diode 26d. Each of the sixth switching element 26s and the sixth diode 26d is provided at the second surface 20a. Each of the sixth switching element 26s and the sixth diode 26d is electrically connected to the third terminal unit 23e and the fourth terminal unit 24e.

The third circuit substrate 300 further includes a seventh switching element 37s and a seventh diode 37d. Each of the seventh switching element 37s and the seventh diode 37d is provided at the third surface 30a. Each of the seventh switching element 37s and the seventh diode 37d is electrically connected to the fifth terminal unit 35e and the sixth terminal unit 36e.

The fourth circuit substrate 400 further includes an eighth switching element 48s and an eighth diode 48d. Each of the eighth switching element 48s and the eighth diode 48d is provided at the fourth surface 40a. Each of the eighth switching element 48s and the eighth diode 48d is electrically connected to the seventh terminal unit 47e and the eighth terminal unit 48e.

Thus, multiple switching elements and multiple diodes may be provided in each of the circuit substrates. In the semiconductor device 501 as well, the switching elements that are provided in the opposing substrates are not simultaneously switched to the on-state. Components of the orientations of the current flowing in the opposing substrates are reversely oriented with respect to each other. Thereby, the effect of the parasitic inductances can be reduced. Further, the first to fourth circuit substrates 100 to 400 are disposed three-dimensionally. Thereby, the mounting surface area can be reduced.

According to the embodiments, a highly reliable semiconductor device can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components such as the first to fourth circuit substrates, the first to fourth substrates, the first to fourth switching elements, the first to eighth terminal units, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
   a first circuit substrate including
      a first substrate having a first surface,
      a first switching element provided at the first surface,
      a first terminal unit provided in the first substrate and electrically connected to the first switching element, and a second terminal unit provided in the first substrate, electrically connected to the first switching element, and set to a potential lower than a potential of the first terminal unit;

a second circuit substrate including
   a second substrate having a second surface,
   a second switching element provided at the second surface,
   a third terminal unit provided in the second substrate and electrically connected to the second switching element, and
   a fourth terminal unit provided in the second substrate, electrically connected to the second switching element, and set to a potential lower than a potential of the third terminal unit;

a third circuit substrate including
   a third substrate having a third surface,
   a third switching element provided at the third surface,
   a fifth terminal unit provided in the third substrate and electrically connected to the third switching element, and
   a sixth terminal unit provided in the third substrate, electrically connected to the third switching element, and set to a potential lower than a potential of the fifth terminal unit; and a fourth circuit substrate including
   a fourth substrate having a fourth surface,
   a fourth switching element provided at the fourth surface,
   a seventh terminal unit provided in the fourth substrate and electrically connected to the fourth switching element, and
   an eighth terminal unit provided in the fourth substrate, electrically connected to the fourth switching element, and set to a potential lower than a potential of the seventh terminal unit, the second terminal unit and the third terminal unit being electrically connected,
the sixth terminal unit and the seventh terminal unit being electrically connected,
the third surface overlapping at least a portion of the first surface when projected onto the first surface,
the fourth surface overlapping at least a portion of the second surface when projected onto the second surface,
a component of a direction from the first terminal unit toward the second terminal unit being reversely oriented with respect to a component of a direction from the fifth terminal unit toward the sixth terminal unit when projected onto a plane including a first direction from the first circuit substrate toward the second circuit substrate and a second direction from the first circuit substrate toward the third circuit substrate,
a component of a direction from the third terminal unit toward the fourth terminal unit being reversely oriented with respect to a component of a direction from the seventh terminal unit toward the eighth terminal unit when projected onto the plane.

2. The device according to claim 1, wherein the fourth circuit substrate is arranged with the second circuit substrate in the second direction and arranged with the third circuit substrate in the first direction.

3. The device according to claim 1, wherein a component of an orientation of a current flowing from the first terminal unit toward the second terminal unit is reversely oriented with respect to a component of an orientation of a current flowing from the fifth terminal unit toward the sixth terminal unit.

4. The device according to claim 1, wherein
the first circuit substrate further includes:
   a first interconnect unit provided at the first surface to electrically connect the first switching element and the first terminal unit; and
   a second interconnect unit provided at the first surface to electrically connect the first switching element and the second terminal unit,
the second circuit substrate further includes:
   a third interconnect unit provided at the second surface to electrically connect the second switching element and the third terminal unit; and
   a fourth interconnect unit provided at the second surface to electrically connect the second switching element and the fourth terminal unit,
the third circuit substrate further includes:
   a fifth interconnect unit provided at the third surface to electrically connect the third switching element and the fifth terminal unit; and
   a sixth interconnect unit provided at the third surface to electrically connect the third switching element and the sixth terminal unit,
the fourth circuit substrate further includes:
   a seventh interconnect unit provided at the fourth surface to electrically connect the fourth switching element and the seventh terminal unit; and
   an eighth interconnect unit provided at the fourth surface to electrically connect the fourth switching element and the eighth terminal unit,
the sixth interconnect unit overlaps at least a portion of the first interconnect unit when projected onto the first surface, and
the fifth interconnect unit overlaps at least a portion of the second interconnect unit when projected onto the first surface.

5. The device according to claim 4, wherein
the eighth interconnect unit overlaps at least a portion of the third interconnect unit when projected onto the second surface, and
the seventh interconnect unit overlaps at least a portion of the fourth interconnect unit when projected onto the second surface.

6. The device according to claim 4, wherein a component of a direction from the first interconnect unit toward the second interconnect unit is reversely oriented with respect to a component of a direction from the fifth interconnect unit toward the sixth interconnect unit.

7. The device according to claim 4, wherein a component of a direction from the third interconnect unit toward the fourth interconnect unit is reversely oriented with respect to a component of a direction from the seventh interconnect unit toward the eighth interconnect unit.

8. The device according to claim 4, wherein
the first circuit substrate further includes a first connection member, and
the first connection member electrically connects the second interconnect unit and the first switching element.

9. The device according to claim 4, wherein
the first switching element includes a source terminal and a drain terminal,
the drain terminal is electrically connected to the first interconnect unit, and
the source terminal is electrically connected to the second interconnect unit.

10. The device according to claim 1, wherein
the first switching element is provided between the first surface and the third surface, and the third switching element is provided between the first surface and the third surface.

11. The device according to claim 1, wherein
the second switching element is provided between the second surface and the fourth surface, and
the fourth switching element is provided between the second surface and the fourth surface.

12. The device according to claim 1, wherein the first circuit substrate further includes a first diode including a first cathode and a first anode, the first cathode being electrically connected to the first terminal unit, the first anode being electrically connected to the second terminal unit.

13. The device according to claim 1, wherein the first circuit substrate further includes a fifth switching element provided at the first surface and electrically connected to the first terminal unit and the second terminal unit.

14. The device according to claim 1, further comprising a condenser,
one end of the condenser being electrically connected to the first terminal unit and the fifth terminal unit,
the other end of the condenser being electrically connected to the fourth terminal unit and the eighth terminal unit.

15. The device according to claim 1, wherein
the third surface is parallel to the first surface, and the fourth surface is parallel to the second surface.

16. The device according to claim 1, wherein
the second surface is parallel to the first surface, and
the fourth surface is parallel to the third surface.

17. The device according to claim 1, wherein
the second substrate is disposed in a plane including the first surface, and
the fourth substrate is disposed in a plane including the third surface.

18. The device according to claim 1, wherein the first switching element is a bipolar transistor or a field effect transistor.

19. The device according to claim 1, wherein each of the first circuit substrate, the second circuit substrate, the third circuit substrate, and the fourth circuit substrate includes a plurality of switching elements.

20. The device according to claim 1, wherein each of the first circuit substrate, the second circuit substrate, the third circuit substrate, and the fourth circuit substrate includes a plurality of diodes.

* * * * *